United States Patent [19]

Keller et al.

[11] 4,436,578
[45] Mar. 13, 1984

[54] METHOD OF SETTING A STABLE MELTING ZONE IN A SEMICONDUCTOR CRYSTALLINE ROD DURING CRUCIBLE-FREE ZONE MELTING THEREOF

[75] Inventors: Wolfgang Keller, Munich; Gerhard Schrötter, Neufahrn, both of Fed. Rep. of Germany

[73] Assignee: Siemens Aktiengesellschaft, Berlin and Munich, Fed. Rep. of Germany

[21] Appl. No.: 231,028

[22] Filed: Feb. 3, 1981

Related U.S. Application Data

[63] Continuation-in-part of Ser. No. 12,386, Feb. 15, 1979, abandoned.

[30] Foreign Application Priority Data

Feb. 27, 1978 [DE] Fed. Rep. of Germany ....... 2808401

[51] Int. Cl.³ .............................................. C30B 13/20
[52] U.S. Cl. .................................................... 156/620
[58] Field of Search ...................... 156/620, DIG. 89; 75/65 ZM; 422/250; 13/DIG. 1; 219/10.49, 10.79, 10.75, 10.67

[56] References Cited

U.S. PATENT DOCUMENTS 3,660,062 5/1972 Keller .......................... 156/DIG. 89

FOREIGN PATENT DOCUMENTS 2019179 4/1971 Fed. Rep. of Germany ...... 156/620
2640641 3/1978 Fed. Rep. of Germany ...... 156/620
1361710 7/1974 United Kingdom ................ 156/620

Primary Examiner—Hiram H. Bernstein
Attorney, Agent, or Firm—Herbert L. Lerner

[57] ABSTRACT

Method of setting a stable melting zone in a semiconductor crystalline rod during crucible-free zone melting thereof, by means of a single-winding induction heating coil having an inner diameter smaller than the diameter of a portion of the rod being fed to the melting zone which includes performing the crucible-free zone melting in an argon atmosphere at an overpressure in vicinity of at least 1.5 ata and maximally 6 ata, and setting the outer melting-zone height at a value of between 15 and 23 mm for a diameter of the recrystallized rod portion within a range of 30 to 50 mm, at a value of between 18 and 26 mm for a diameter of the recrystallized rod portion within a range of 50 to 75 mm and at a limiting value of 32 mm for a rod diameter greater than 75 mm.

1 Claim, 1 Drawing Figure

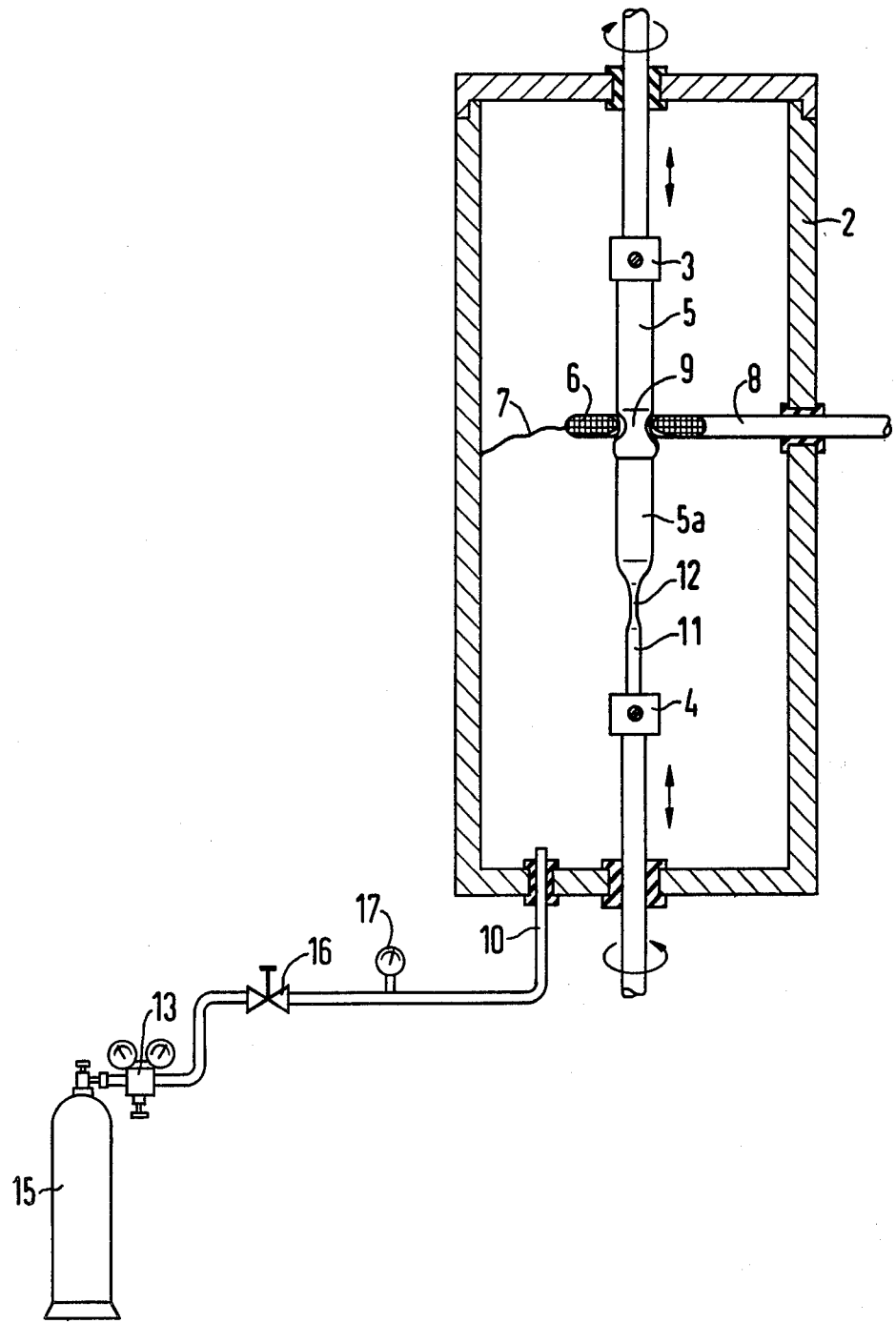

METHOD OF SETTING A STABLE MELTING ZONE IN A SEMICONDUCTOR CRYSTALLINE ROD DURING CRUCIBLE-FREE ZONE MELTING THEREOF

This application is a continuation-in-part of application Ser. No. 012,386, filed Feb. 15, 1979, now abandoned.

The invention relates to a method of setting or adjusting a stable melting or molten zone in a semiconductor crystalline rod, such as a dislocation-free silicon monocrystalline rod for example, during crucible-free zone melting thereof, such as is disclosed in German Published Nonprosecuted Patent Application DE OS 26 40 641, by means of a single-winding induction heating coil with an inner diameter smaller than the diameter of the rod portion fed to the melting zone, the outer melting-zone height being set to a value between 15 and 23 mm for a diameter of the recrystallized rod portion in vicinity of 30 to 50 mm, to a value between 18 and 26 mm for a diameter of the recrystallized rod portion in vicinity of 50 to 75 mm, and to a limit value of 32 mm for a rod diameter greater than 75 mm.

It is an object of the invention to provide an improvement in the hereinaforedescribed method of the German published non-prosecuted patent application with respect to improving the crystal quality and, moreover, especially with respect to a reduction in a tendency toward short-circuiting between the induction heating coil and the semiconductor rod in the protective gas atmosphere during the crucible-free zone melting operation.

With the foregoing and other objects in view, there is provided, in accordance with the invention, a method of setting or adjusting a stable melting zone in a semiconductor crystalline rod during crucible-free zone melting thereof corresponding to the foregoing but wherein, furthermore, the argon atmosphere in which the zone melting operation is performed is maintained at an overpressure within the range of at least 1.5 atmospheres absolute and maximally 6 atmospheres absolute.

In accordance with another mode of the method of the invention, the pressure of the argon atmosphere is held constant during the crucible-free zone melting operation.

In accordance with a further mode of the method of the invention, the argon atmosphere is provided with a degree of purity of 99.999%.

Other features which are considered as characteristic for the invention are set forth in the appended claims.

Although the invention is illustrated and described herein as embodied in a method of setting a stable melting zone in a semiconductor crystalline rod during crucible-free zone melting thereof, it is nevertheless not intended to be limited to the details shown, since various modifications may be made therein without departing from the spirit of the invention and within the scope and range of equivalents of the claims.

The invention, however, together with additional objects and advantages thereof will be best understood from the following description when read in connection with the accompanying single FIGURE of the drawing which is a partly sectional diagrammatic view of apparatus including a receptacle wherein a silicon rod is disposed during a crucible-free zone melting operation, a stable melting zone being adjusted or set therein in accordance with the method of the invention.

Referring now to the drawing, there is shown therein a receptacle 2 provided for the crucible-free zone melting operation wherein a vertically disposed silicon crystal rod 5 is clamped at the ends thereof in holders 3 and 4. A heating device formed of an induction heating coil 6 supplied with high-frequency current and having a center tap 7 is fastened to a carrier 8 and produces a melting or molten zone 9 in the silicon rod 5 which separates a recrystallized rod portion 5a from a supply rod portion thereof. A seed crystal 11 oriented, for example, in (111)-direction is clamped in the holder 4 and is formed with a bottle-neck shaped construction 12 extending toward the recrystallized rod portion 5a.

At the beginning of the rod-pulling operation in direction of the arrows, an argon atmospheric pressure of about 0.6 atmospheres atu or 1.6 atmospheres absolute (ata) is set in the receptacle 2. this is effected by feeding argon having a degree of purity of 99.999% from a supply bottle or tank 15 through a conduit or pipe system 10 into the receptacle 2 that has been evacuated to a pressure of $10^{-5}$ mm Hg. A reducing valve 13, a shut-off valve 16, as well as a pressure gauge 17 are disposed in the pipe system 10. The reducing valve 13 is opened and, by actuating the shut-off or metering valve 16, the desired pressure of 0.6 atu is set at the pressure gauge 17 and is kept constant during the zone melting process.

The pulling speed is set at 4 mm/min. and the rotational speed of the holder 4 for the resolidified (recrystallized) rod portion 5a at 15 RPM.

When adhering to the hreinaforementioned conditions, a dislocation-free silicon monocrystalline rod of 100 cm length and 80 mm diameter is able to be produced.

The method according to the invention can be combined, with special advantage, also with method steps such as are described, for example, in German Patent DE-PS 12 18 404 "Method of Crucible-Free Zone Melting a Crystalline Rod, Especially a Semiconductor Rod"(with lateral shifting of the resolidified rod portion) and/or in the German Published Non-Prosecuted Application DE-OS 25 48 050 (support in the rod cone).

There are claimed:

1. Method of setting a stable melting zone in a semiconductor crystalline rod during crucible-free zone melting thereof in a receptacle, by means of a single-winding induction heating coil having an inner diameter smaller than the diameter of a portion of the rod being fed to the melting zone which comprises evacuating the receptacle to a pressure of $10^{-5}$ mm Hg, subsequently performing the crucible-free zone melting in an argon atmosphere having a degree of purity of 99.999% in the receptacle at a constantly maintained overpressure in vicinity of at least 1.5 ata and maximally 6 ata, and setting the outer melting-zone height at a value of between 15 and 23 mm for a diameter of the recyrstallized rod portion within a range of 30 to 50 mm, at a value of between 18 and 26 mm for a diameter of the recrystallized rod portion within a range of 50 to 75 mm and at a limiting value of 32 mm for a rod diameter greater than 75 mm.

* * * * *